United States Patent
Yanagisawa

(10) Patent No.: US 8,816,430 B2
(45) Date of Patent: Aug. 26, 2014

(54) SEMICONDUCTOR DEVICE AND METHOD FOR MANUFACTURING SAME

(75) Inventor: Hiroyuki Yanagisawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 13/352,858

(22) Filed: Jan. 18, 2012

(65) Prior Publication Data

US 2012/0306007 A1    Dec. 6, 2012

(30) Foreign Application Priority Data

Jun. 3, 2011    (JP) .................................. 2011-125173

(51) Int. Cl.
*H01L 29/66*    (2006.01)

(52) U.S. Cl.
USPC    257/330; 257/64; 257/E29.292; 257/E29.257; 438/150; 438/187; 438/198; 438/242; 438/700

(58) Field of Classification Search
None
See application file for complete search history.

(56) References Cited

U.S. PATENT DOCUMENTS

| | | | |
|---|---|---|---|
| 5,747,851 A * | 5/1998 | Tomatsu et al. | 257/330 |
| 5,960,271 A * | 9/1999 | Wollesen et al. | 438/197 |
| 2007/0069255 A1 | 3/2007 | Kim | |

FOREIGN PATENT DOCUMENTS

| | | |
|---|---|---|
| JP | 58-98927 | 6/1983 |
| JP | 63-197375 | 8/1988 |
| JP | 10-125916 | 5/1998 |
| JP | 2007-19513 | 1/2007 |
| JP | 2007-081396 A | 3/2007 |

OTHER PUBLICATIONS

Hitoshi Wakabayashi, et al., "Sub-10-nm Planar-Bulk-CMOS Devices using Lateral Junction Control", 10-1109/IEDM.2003. 1269446, IEEE, 2003, 3 pages.

Japanese Office Action issued Apr. 2, 2014, in Japan Patent Application No. 2011-125173 (with English translation).

* cited by examiner

*Primary Examiner* — Yasser A Abdelaziez

(74) *Attorney, Agent, or Firm* — Oblon, Spivak, McClelland, Maier & Neustadt, L.L.P.

(57) ABSTRACT

According to one embodiment, a semiconductor device includes a substrate, a gate electrode, source/drain regions, and a gate insulating film. The substrate is made of monocrystalline silicon, an upper surface of the substrate is a (100) plane, and a trench is made in the upper surface. The gate electrode is provided in at least an interior of the trench. The source/drain regions are formed in regions of the substrate having the trench interposed. The gate insulating film is provided between the substrate and the gate electrode. The trench includes a bottom surface made of a (100) plane, a pair of oblique surfaces made of (111) planes contacting the bottom surface, and a pair of side surfaces made of (110) planes contacting the oblique surfaces. The source/drain regions are in contact with the side and oblique surfaces and are apart from a central portion of the bottom surface.

14 Claims, 5 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2011-125173, filed on Jun. 3, 2011; the entire contents of which are incorporated herein by reference.

FIELD

Embodiments described herein relate generally to a semiconductor device and a method for manufacturing the same.

BACKGROUND

In recent years, a recessed channel transistor (RCAT) in which the lower portion of the gate electrode is buried in the interior of a silicon substrate has been proposed as a MOSFET (Metal-Oxide-Semiconductor Field-Effect Transistor) to increase the on-state current and downscale while suppressing the leak current between the source and the drain. In the RCAT as well, it is desirable to increase the on-state current even further.

DETAILED DESCRIPTION

In general, according to one embodiment, a semiconductor device includes a substrate, a gate electrode, source/drain regions, and a gate insulating film. The substrate is made of monocrystalline silicon, an upper surface of the substrate is a (100) plane, and a trench is made in the upper surface. The gate electrode is provided in at least an interior of the trench. The source/drain regions are formed in regions of the substrate having the trench interposed. The gate insulating film is provided between the substrate and the gate electrode. The trench includes a bottom surface made of a (100) plane of silicon, a pair of oblique surfaces made of (111) planes of silicon contacting the bottom surface, and a pair of side surfaces made of (110) planes of silicon contacting the oblique surfaces. The source/drain regions are in contact with the side surfaces and the oblique surfaces and are apart from a central portion of the bottom surface.

In general, according to one embodiment, a method is disclosed for manufacturing a semiconductor device. The method can include forming a mask film on a substrate made of monocrystalline silicon. An upper surface of the substrate is a (100) plane of silicon, and an opening is made in the mask film. The method can include making a trench by performing wet etching using an alkaline etchant and using the mask film as a mask. The trench includes a bottom surface made of a (100) plane of silicon, a pair of oblique surfaces made of (111) planes of silicon contacting the bottom surface, and a pair of side surfaces made of (110) planes of silicon contacting the oblique surfaces. The method can include forming a gate insulating film on the bottom surface, on the oblique surfaces, and on the side surfaces. The method can include forming a gate electrode in at least an interior of the trench. The method can include implanting an impurity into regions of the substrate having the trench interposed. In addition, the method can include forming source/drain regions by causing the impurity to diffuse. The source/drain regions are in contact with the side surfaces and the oblique surfaces and are apart from a central portion of the bottom surface.

Various embodiments will be described hereinafter with reference to the accompanying drawings.

Figure 1:
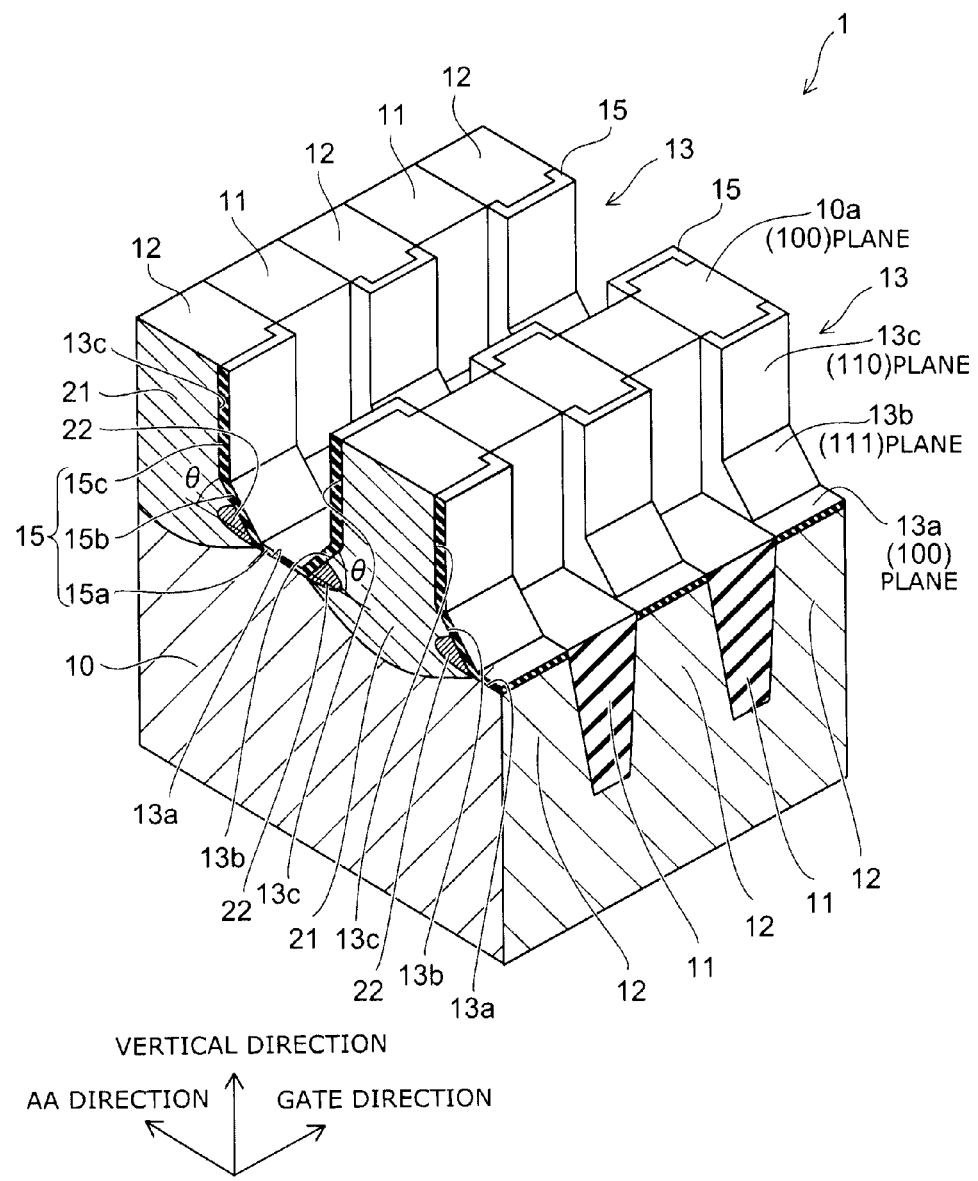
FIG. 1 is a perspective cross-sectional view illustrating a semiconductor device according to an embodiment.

FIG. 1 is a perspective cross-sectional view illustrating a semiconductor device according to the embodiment.

Figure 2:
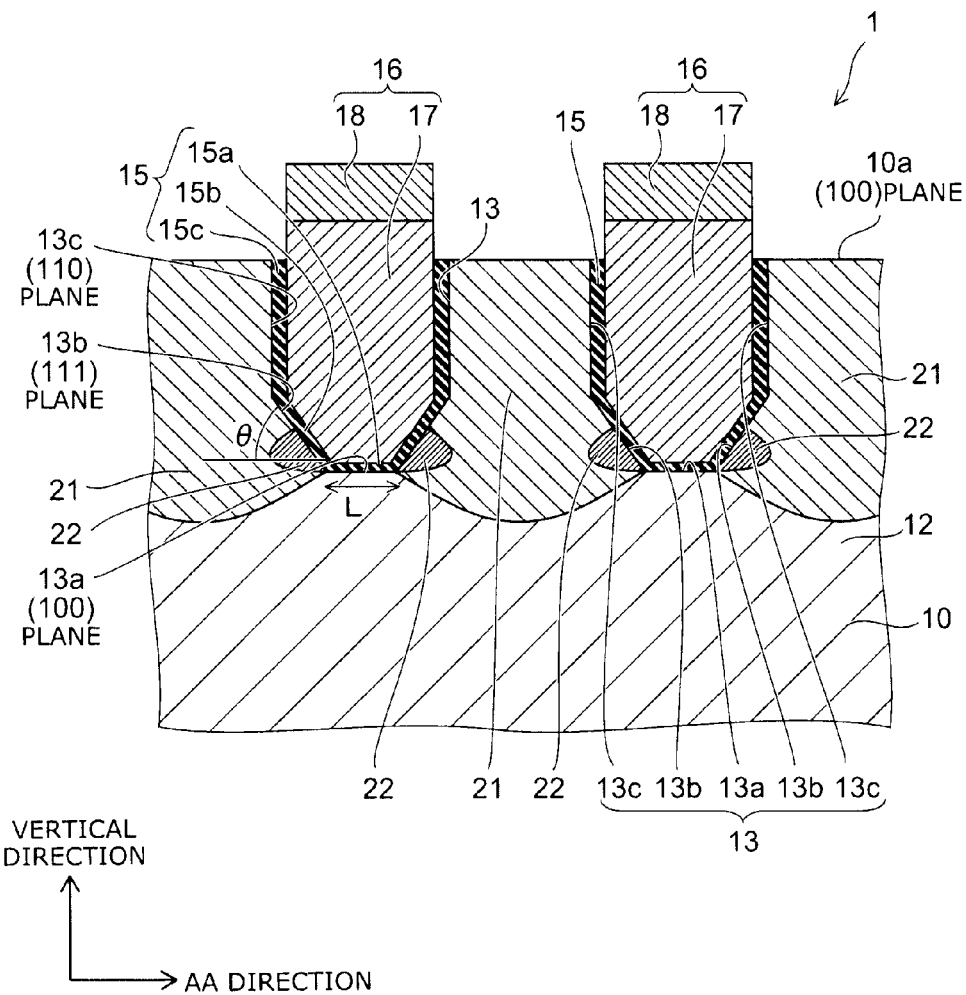
FIG. 2 is a cross-sectional view illustrating the semiconductor device according to the embodiment.

FIG. 2 is a cross-sectional view illustrating the semiconductor device according to the embodiment.

The gate electrodes are not illustrated for convenience of illustration in FIG. 1.

As illustrated in FIG. 1 and FIG. 2, a silicon substrate 10 is provided in the semiconductor device 1 according to the embodiment. The silicon substrate 10 is made of monocrystalline silicon; and an upper surface 10a of the silicon substrate 10 is a (100) plane of silicon. Multiple device isolation insulators (STI) 11 are buried in the upper layer portion of the silicon substrate 10 to extend in line configurations in one direction. The device isolation insulators 11 are made of an insulating material such as, for example, silicon oxide and are arranged periodically. The upper layer portion of the silicon substrate 10 is divided into multiple active areas 12 by the device isolation insulators 11. In other words, the device isolation insulators 11 and the active areas 12 are alternately arranged periodically.

Hereinbelow, the direction parallel to the upper surface $10a$ of the silicon substrate 10 in which the device isolation insulators 11 and the active areas 12 extend is called the "AA direction"; and the arrangement direction of the device isolation insulators 11 and the active areas 12 is called the "gate direction". A direction perpendicular to the upper surface $10a$ is called the "vertical direction". The AA direction, the gate direction, and the vertical direction are mutually orthogonal.

Trenches 13 are multiply provided in the upper surface $10a$ of the silicon substrate 10 to extend in the gate direction. The trenches 13 are made across the multiple device isolation insulators 11 and the multiple active areas 12.

The portion of the trench 13 positioned inside the active area 12 has a substantially hexagonal columnar configuration extending in the gate direction. The trench 13 positioned inside the active area 12 has a substantially hexagonal configuration from which the corners at two locations on the lower side have been cut off the rectangular configuration in a cross section parallel to the AA direction and the vertical direction. In other words, the trench 13 includes one bottom surface $13a$, a pair of oblique surfaces $13b$ contacting the bottom surface $13a$, and a pair of side surfaces $13c$ contacting the oblique surfaces $13b$. The bottom surface $13a$ is formed of a (100) plane of silicon; the oblique surfaces $13b$ are formed of (111) planes of silicon; and the side surfaces $13c$ are formed of (110) planes of silicon. An angle θ between the bottom surface $13a$ and the oblique surface $13b$ is 55°.

On the other hand, the portion of the trench 13 positioned inside the device isolation insulator 11 has a substantially quadrilateral columnar configuration extending in the gate direction. In the cross section parallel to the AA direction and the vertical direction, the trench 13 positioned inside the device isolation insulator 11 has a trapezoidal configuration in which the upper side is longer than the lower side or a rectangular configuration. The width, i.e., the length in the AA direction, of the portion of the trench 13 positioned inside the device isolation insulator 11 is greater than the width of the portion of the trench 13 positioned inside the active area 12. The depth, i.e., the length in the vertical direction, of the portion of the trench 13 positioned inside the device isolation insulator 11 is substantially equal to the depth of the portion of the trench 13 positioned inside the active area 12.

A gate insulating film 15 made of, for example, silicon oxide is formed on the inner surface of the portion of the trench 13 positioned inside the active area 12. A gate electrode 16 is provided in the interior of the trench 13 and above the trench 13. For example, a lower portion 17 made of polysilicon into which an impurity is introduced and an upper portion 18 made of a metal, e.g., tungsten, are provided as the gate electrode 16. The upper portion 18 is provided higher than the upper surface 10a of the silicon substrate 10. Thus, the gate insulating film 15 is disposed between the silicon substrate 10 and the gate electrode 16.

The film thickness of the gate insulating film 15 differs by position. A portion 15a formed on the bottom surface 13a is relatively thin; a portion 15b formed on the oblique surface 13b is thicker than the portion 15a; and a portion 15c formed on the side surface 13c is thicker than the portion 15b. As an example, the film thickness of the portion 15b of the gate insulating film 15 is about 1.15 times the film thickness of the portion 15a; and the film thickness of the portion 15c is about 1.50 times the film thickness of the portion 15a.

Source/drain regions 21 are formed in the portions of the active area 12 of the silicon substrate 10 interposed between the trenches 13 and in the regions directly under the portions of the active area 12 of the silicon substrate 10 interposed between the trenches 13. In other words, the source/drain regions 21 are formed in regions of the silicon substrate 10 having the trench 13 interposed. The conductivity type of the source/drain regions 21 is, for example, an n type; and the source/drain regions 21 contain, for example, phosphorus as an impurity. The source/drain regions 21 contact the side surfaces 13c and the oblique surfaces 13b of the trench 13 but do not contact the AA-direction central portion of the bottom surface 13a. That is, the source/drain regions 21 are apart from the AA-direction central portion of the bottom surface 13a. It is favorable for the source/drain regions 21 not to contact the entire region of the bottom surface 13a. The source/drain regions 21 may not contact the lower portions of the oblique surfaces 13b. The portions of the active area 12 excluding the source/drain regions 21 are used as channel regions having, for example, a p conductivity type.

An impurity diffusion region 22 is formed in the portion of the silicon substrate 10 contacting the lower portion of the oblique surface 13b of the trench 13. The impurity diffusion region 22 contains an impurity of a type different from the impurity contained in the source/drain regions 21. The impurity contained in the impurity diffusion region 22 is, for example, an impurity, e.g., carbon, that substantially does not affect the electrical conductivity of silicon. Fluorine or boron may be used instead of carbon. The impurity diffusion region 22 does not contact the bottom surface 13a, the side surface 13c, and the upper portion of the oblique surface 13b of the trench 13.

A method for manufacturing the semiconductor device according to the embodiment will now be described.

FIGS. 3A to 3C, FIGS. 4A to 4C, and FIGS. 5A to 5C are cross-sectional views of processes, illustrating the method for manufacturing the semiconductor device according to the embodiment.

Figure 3A:
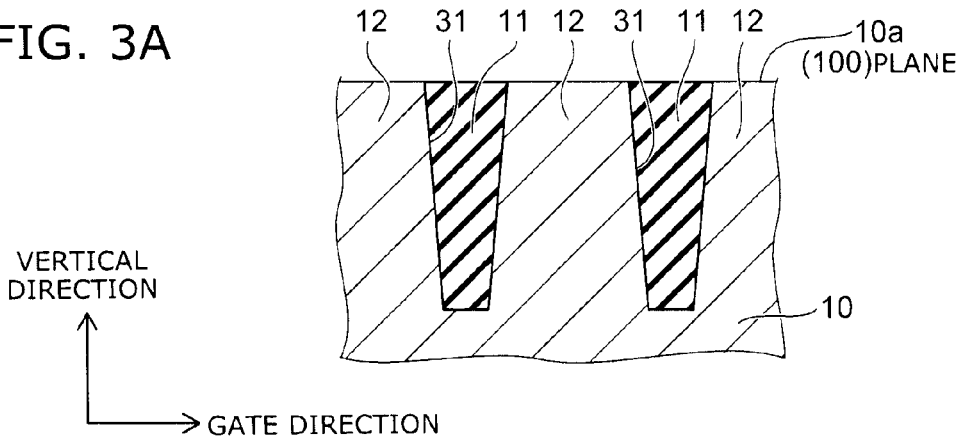
FIGS. 3A to 3C, FIGS. 4A to 4C, and FIGS. 5A to 5C are cross-sectional views of processes, illustrating a method for manufacturing the semiconductor device according to the embodiment.

FIG. 3A illustrates a cross section parallel to the gate direction and the vertical direction. FIG. 3B to FIG. 5C illustrate cross sections parallel to the AA direction and the vertical direction.

First, as illustrated in FIG. 3A, the silicon substrate 10 made of monocrystalline silicon and having the upper surface 10a formed of a (100) plane is prepared. Then, multiple trenches 31 extending in the AA direction are made in the upper surface 10a of the silicon substrate 10. Continuing, the device isolation insulators 11 are formed by filling silicon oxide into the trenches 31. Thereby, the upper layer portion of the silicon substrate 10 is divided into the multiple active areas 12 by the device isolation insulators 11.

Figure 3B:
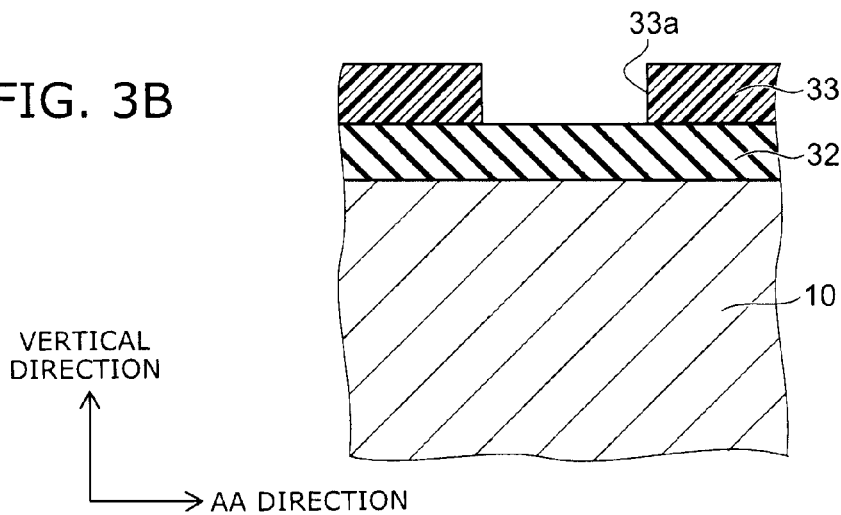

Then, as illustrated in FIG. 3B, a mask film 32 is formed on the silicon substrate 10 by depositing a material, e.g., silicon nitride, that has resistance to an alkaline etchant and etching selectivity with respect to silicon and silicon oxide. Another film may be stacked on the silicon nitride film in the mask film 32. The mask film 32 may be formed of a material other than silicon nitride.

Continuing, a resist pattern 33 is formed by forming a resist film on the mask film 32 and patterning using lithography. Openings 33a are made in line configurations in the regions of the resist pattern 33 where the trenches 13 are to be made. Then, the mask film 32 is etched using the resist pattern 33 as a mask.

Figure 3C:
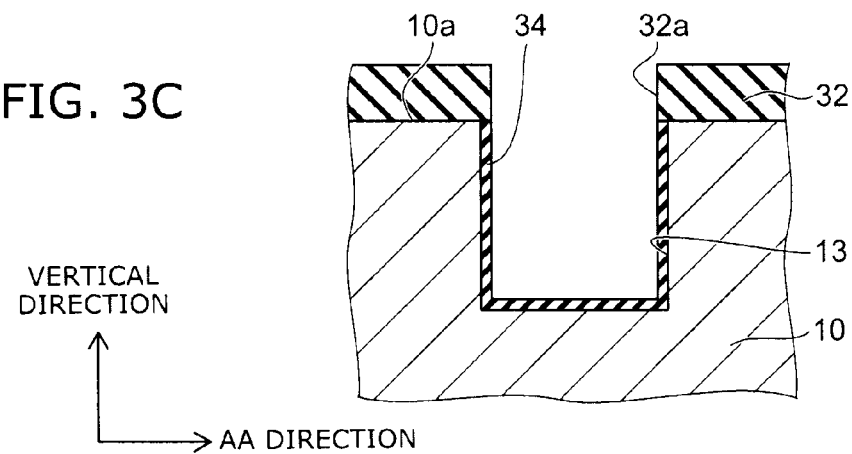

Thereby, as illustrated in FIG. 3C, openings 32a are made in the mask film 32 in the regions directly under the openings 33a of the resist pattern 33. Thus, the mask film 32 in which the openings 32a are made in line configurations extending in the gate direction is formed on the silicon substrate 10.

Then, dry etching such as RIE (reactive ion etching) and the like is performed using the mask film 32 as a mask. Thereby, the trenches 13 are made in the upper surface 10a of the silicon substrate 10 by the portions of the silicon substrate 10 corresponding to the regions directly under the openings 32a being selectively removed. At this stage, the trench 13 has a substantially quadrilateral configuration in the cross section parallel to the AA direction and the vertical direction. The portion of the trench 13 positioned inside the device isolation insulator 11 is shallower than the portion of the trench 13 positioned inside the active area 12. Then, a silicon oxide film 34 is formed on the inner surface of the portion of the trench 13 positioned inside the active area 12 by performing ashing. Continuing, cleaning is performed using, for example, SH (a mixed liquid of sulfuric acid and aqueous hydrogen peroxide) and NC2 (New Clean 2). NC2 is alkaline and is a mixed liquid of TMY (trimethyl-2 hydroxyethyl ammonium hydroxide) and aqueous hydrogen peroxide. Then, a channel region (not illustrated) is formed in the active area 12 by ion implantation of an impurity.

Figure 4A:
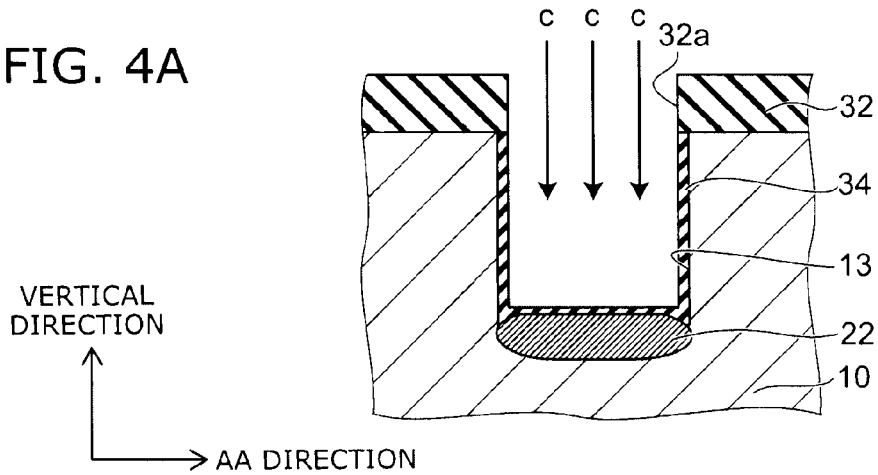

Continuing as illustrated in FIG. 4A, ion implantation of an impurity such as, for example, carbon, fluorine, or boron, e.g., carbon, into the upper layer portion of the silicon substrate 10 is performed through the silicon oxide film 34 using the mask film 32 as a mask. Thereby, the impurity diffusion region 22 containing, for example, carbon is formed in the portion of the silicon substrate 10 contacting the bottom surface 13a of the trench 13.

Figure 4B:
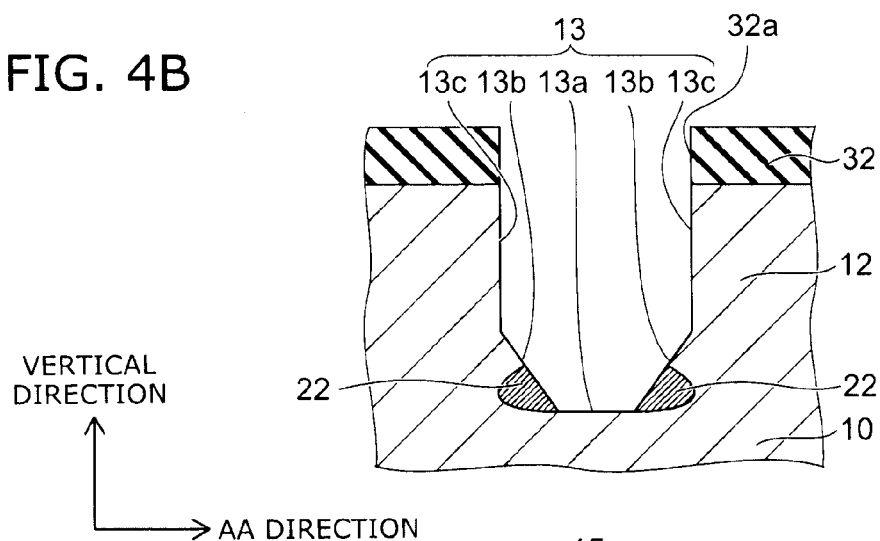

Then, as illustrated in FIG. 4B, wet processing is performed using DHF (diluted hydrofluoric acid). Thereby, the silicon oxide film 34 is removed. At this time, the width of the trench 13 is widened and the depth of the trench 13 is deepened by etching the portion of the trench 13 made inside the device isolation insulator 11 (referring to FIG. 3A). As a result, the portion of the trench 13 made inside the device isolation insulator 11 has a width wider than that of the portion of the trench 13 made inside the active area 12 and substantially the same depth as that of the portion of the trench 13 made inside the active area 12.

Then, wet etching is performed using an alkaline etchant using the mask film 32 as a mask. For example, NC2 having a temperature of 75° C. is used as the etchant. Other than NC2 which is a mixed liquid of $H_2O_2$ (aqueous hydrogen peroxide) and TMY, an etchant including one type of chemical liquid selected from the group consisting of KOH (potassium hydroxide), TMAH (tetramethyl ammonium hydroxide), EDP (ethylene diamine pyrocatechol), and $N_2H_4$—$H_2O$ (hydrazine hydrate) may be used as the alkaline etchant. Thereby, the portion of the silicon substrate 10 exposed at the inner surface of the trench 13 is removed further.

This etching is anisotropic etching in which the etching rate differs according to the crystal orientation of the silicon. As a result, the bottom surface 13a made of the (100) plane of silicon, the pair of oblique surfaces 13b made of the (111) planes of silicon contacting the bottom surface 13a, and the pair of side surfaces 13c made of the (110) planes of silicon contacting the oblique surfaces 13b are formed in the trench 13. The angle θ between the bottom surface 13a and the oblique surface 13b is 55°. At this time, the bottom surface 13a of the trench 13 pierces the impurity diffusion region 22. Thereby, the impurity diffusion region 22 no longer exists in the region directly under the bottom surface 13a of the trench 13 and remains only in the portion contacting the lower portion of the oblique surface 13b.

Figure 4C:
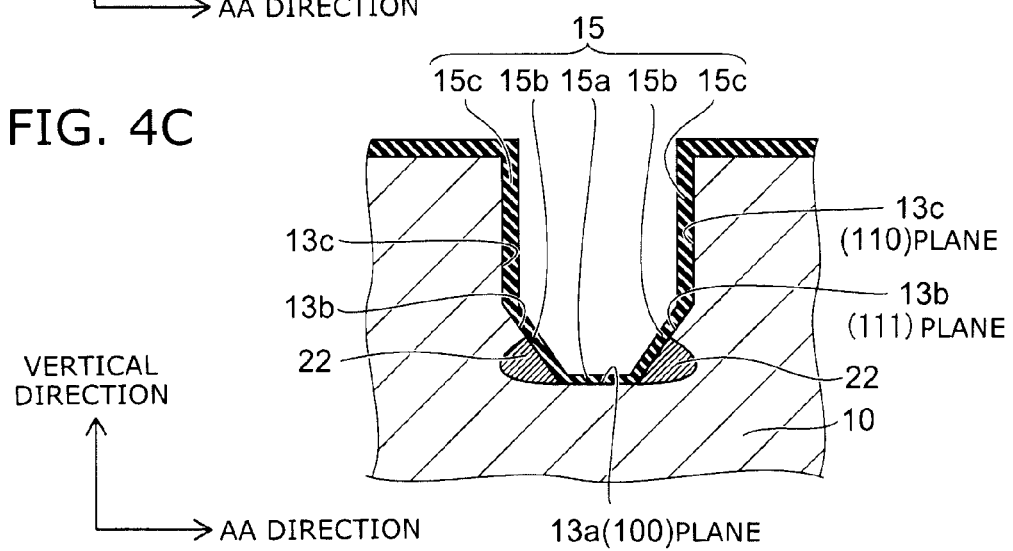

Then, as illustrated in FIG. 4C, the mask film 32 is removed by performing, for example, wet processing using $H_3PO_4$— NC2 at a temperature of 65° C.

Continuing, a thermal oxide film is formed on the exposed portion of the silicon substrate 10 by, for example, performing heat treatment in an oxidation atmosphere. Thereby, the gate insulating film 15 made of silicon oxide is formed on the inner surface of the portion of the trench 13 positioned inside the active area 12. At this time, the film thickness of the gate insulating film 15 differs by portion because the rate of the thermal oxidation differs by crystal plane of the silicon substrate 10. In other words, the portion 15a formed of the (100) plane of silicon formed on the bottom surface 13a is relatively thin. The portion 15b formed of the (111) plane of silicon formed on the oblique surface 13b is thicker than the portion 15a and is, for example, about 1.15 times the portion 15a. The portion 15c formed of the (110) plane of silicon formed on the side surface 13c is thicker than the portion 15b and is, for example, about 1.50 times the portion 15a.

Figure 5A:
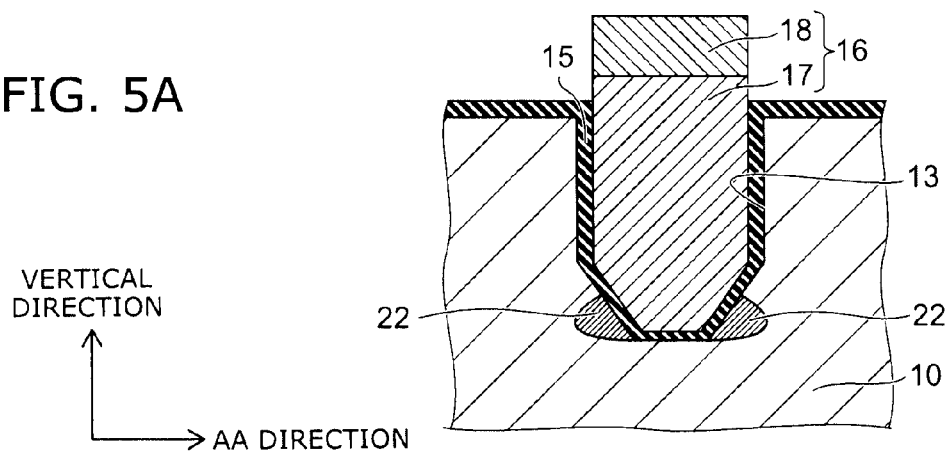

Then, as illustrated in FIG. 5A, polysilicon into which an impurity is introduced is deposited on the entire surface. This polysilicon is filled into the trench 13 and deposited on the silicon substrate 10. Then, a metal film is formed on the polysilicon film by depositing a metal, e.g., tungsten. Continuing, a mask film (not illustrated) is formed on the metal film to cover the region directly above the trench 13. Then, the metal film and the polysilicon film are selectively removed by performing etching using the mask film as a mask. Thereby, the gate electrode 16 is formed in the interior of the trench 13 and above the trench 13. The lower portion 17 of the gate electrode 16 is made of polysilicon; and the upper portion 18 is made of a metal such as tungsten, etc.

Figure 5B:
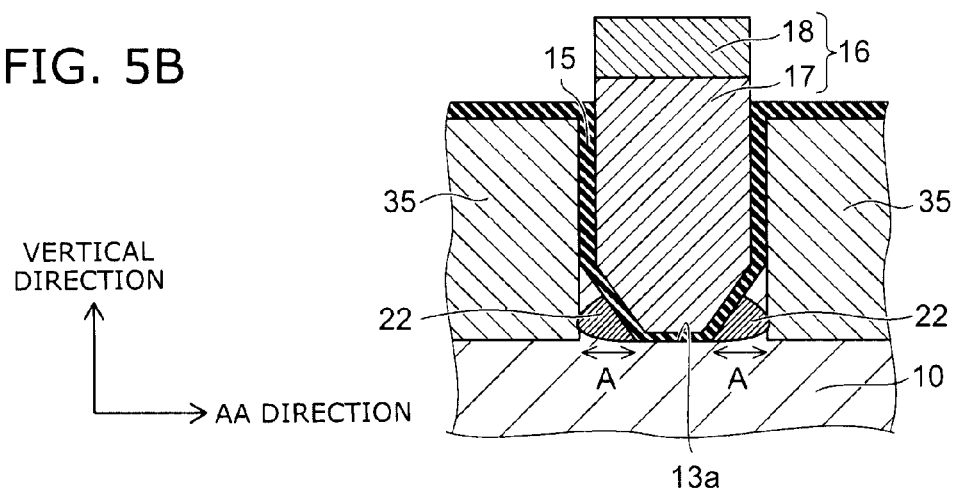

Continuing as illustrated in FIG. 5B, ion implantation of an impurity, e.g., phosphorus, is performed using the gate electrode 16 as a mask. At this time, the depth of the ion implantation is about the same as the depth of the trench 13. Thereby, impurity implantation regions 35 are formed in regions of the silicon substrate 10 having the trench 13 interposed. The impurity implantation regions 35 contact the side surfaces 13c of the trench 13 and do not contact the oblique surfaces 13b and the bottom surface 13a. As a result, a constant offset A is set between the impurity implantation region 35 and the bottom surface 13a of the trench 13 due to the existence of the oblique surface 13b.

Figure 5C:
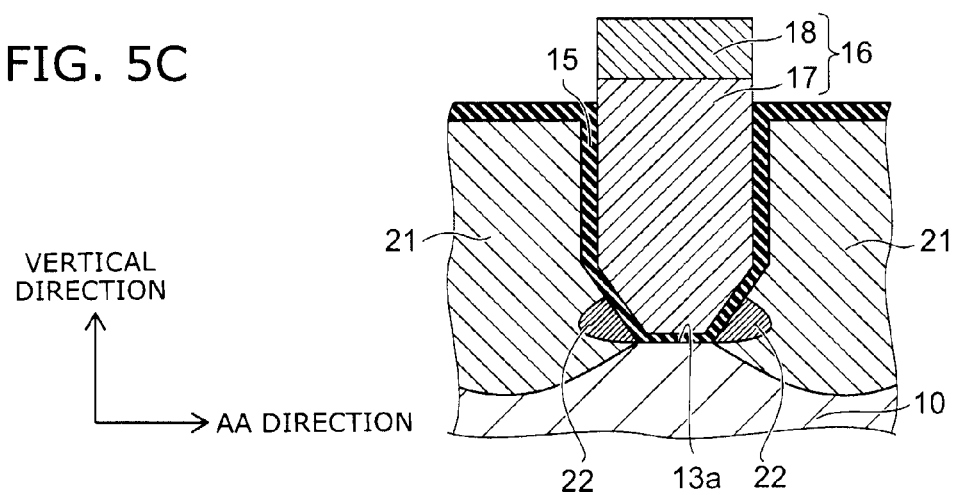

Then, heat treatment is performed as illustrated in FIG. 5C. This heat treatment is performed, for example, at a temperature of 1000° C. for 12 seconds. Thereby, the source/drain regions 21 are formed by the impurity included in the impurity implantation regions 35 being diffused and activated. Although the impurity is diffused to extend around the lower portion of the trench 13 at this time, the impurity does not reach the bottom surface 13a of the trench 13 because the offset A is provided between the impurity implantation region 35 and the bottom surface 13a and because the impurity diffusion region 22 functions as a diffusion prevention region to suppress the diffusion of the implanted impurity (e.g., the phosphorus). Accordingly, the source/drain regions 21 contact the side surfaces 13c and the oblique surfaces of the trench 13 and do not contact the bottom surface 13a.

However, there is a possibility that the relative positional relationship between the source/drain region 21 and the trench 13 may fluctuate because the diffusion length of the impurity may fluctuate somewhat due to the manufacturing conditions. Even in such a case, it is sufficient for the source/drain regions 21 formed on the two sides of the trench 13 not to contact each other by the source/drain regions 21 contacting the AA-direction central portion of the bottom surface 13a; and the source/drain regions 21 may contact the two AA-direction end portions of the bottom surface 13a. Conversely, the source/drain regions 21 may contact only the side surfaces 13c and the upper portions of the oblique surfaces 13b and may not contact the lower portions of the oblique surfaces 13b and the bottom surface 13a.

Then, an upper interconnect structure is formed on the silicon substrate 10 using normal methods. Thus, the semiconductor device 1 illustrated in FIG. 1 and FIG. 2 is manufactured.

Operational effects of the embodiment will now be described.

In the semiconductor device 1 according to the embodiment, the gate electrode 16 is provided in the interior of the trench 13 and above the trench 13; and the source/drain regions 21 are formed on two sides of the gate electrode 16. Thereby, the region of the silicon substrate 10 directly under the gate electrode 16 is used as a channel region to form a recessed channel transistor (RCAT).

In the embodiment, the trench 13 includes the bottom surface 13a, the oblique surfaces 13b, and the side surfaces 13c. Therefore, the width of the gate electrode 16 is narrow at the lowermost portion of the gate electrode 16. As a result, a channel length L (referring to FIG. 2) can be shorter. For example, the channel length L can be about the same as the length of the bottom surface 13a in the AA direction. Thereby, the on-state current of the recessed channel transistor can be increased.

In the embodiment, the thickness of the gate insulating film 15 differs by portion; the portion 15b formed on the oblique surface 13b of the trench 13 is thicker than the portion 15a formed on the bottom surface 13a; and the portion 15c formed on the side surface 13c is thicker than the portion 15b. Thereby, the corners of the gate electrode 16 where the electric field concentrates when driving the semiconductor device 1 can be covered with a thick gate insulating film 15. As a result, the breakdown voltage of the semiconductor device 1 can be increased.

In the method for manufacturing the semiconductor device according to the embodiment, the bottom surface 13a, the oblique surface 13b, and the side surface 13c can be formed in the trench 13 by utilizing the anisotropy of the etching due to the crystal orientation of the silicon by etching the silicon substrate 10 using the alkaline etchant in the process illustrated in FIG. 4B. In other words, the trench 13 can be patterned into the prescribed configuration with good reproducibility. Thereby, the characteristics of the semiconductor device 1 can be stabilized.

In the embodiment, the impurity to be doped into the source/drain region 21 in the process illustrated in FIG. 5B is implanted into the portion of the silicon substrate 10 between the side surfaces 13c. Thereby, the impurity implantation region 35 can be self-aligningly separated from the region to be used as the channel region, i.e., the region directly under the bottom surface 13a of the trench 13. Then, the source/drain region 21 is formed by diffusing the impurity by performing the heat treatment in the process illustrated in FIG. 5C. Accordingly, the impurity can be diffused from the region that is separated from the region to be used as the channel region. As a result, the contact between two source/drain regions 21 formed on the two sides of the gate electrode 16 can be prevented even in the case where the channel length L is designed to be short. It is conceivable to increase the width of the lower portion of the trench 13 to avoid the contact between the source/drain regions. However, in such a case, the channel length increases and the on-state current undesirably decreases.

In the embodiment, the impurity diffusion region 22 is formed by implanting carbon into the region directly under the trench 13 in the process illustrated in FIG. 4A; and the impurity diffusion region 22 remains only in the regions contacting the oblique surfaces 13b of the trench 13 by further etching the inner surface of the trench 13 in the process illustrated in FIG. 4B. Then, an impurity such as phosphorus, etc., is implanted to a depth of about the same as that of the trench 13 in the process illustrated in FIG. 5B; and the impurity is diffused in the process illustrated in FIG. 5C. Thereby, the diffusion of the impurity such as phosphorus, etc., is suppressed by the carbon of the impurity diffusion region 22. In other words, the diffusion of the impurity such as phosphorus, etc., is stopped in the impurity diffusion region 22. As a result, the source/drain region 21 can be reliably prevented from extending around to the region directly under the bottom surface 13a of the trench 13; and the reproducibility of the configuration of the source/drain region 21 improves. Thereby, the characteristics of the semiconductor device 1 are stabilized.

In the embodiment, the source/drain region 21 is formed by performing the ion implantation of the impurity in the process illustrated in FIG. 5B after making the trench 13 by performing the recessing in the process illustrated in FIG. 3C. However, the ion implantation of the impurity may be performed prior to the recessing. Thereby, the impurity can be reliably implanted even in the case where the trench 13 is fine; excessive diffusion after the impurity is implanted can be suppressed; and the controllability of the configuration of the source/drain region 21 can be increased.

Although an example is illustrated in the embodiment in which the upper surface of the silicon substrate 10 and the bottom surface 13a of the trench 13 are made of (100) planes of silicon, the oblique surface 13b is made of a (111) plane of silicon, and the side surface 13c is made of a (110) plane of silicon, this is not limited thereto. If a portion of the inner surface of the trench is formed of the (111) plane of silicon, similar effects are obtained regardless of the crystal plane of the upper surface of the silicon substrate. For example, even in the case where the upper surface of the silicon substrate is the (110) plane and oblique interconnects are formed, it is sufficient for a portion of the inner surface of the trench to be the (111) plane.

According to the embodiments described above, a semiconductor device having a large on-state current and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a substrate made of monocrystalline silicon, an upper surface of the substrate being a (100) plane, a trench being made in the upper surface;
a gate electrode provided in at least an interior of the trench;
source/drain regions formed in regions of the substrate having the trench interposed; and
a gate insulating film provided between the substrate and the gate electrode,
the trench including:
a bottom surface made of a (100) plane of silicon;
a pair of oblique surfaces made of (111) planes of silicon contacting the bottom surface; and
a pair of side surfaces made of (110) planes of silicon contacting the oblique surfaces, and
the source/drain regions being in contact with the side surfaces and the oblique surfaces and being apart from a central portion of the bottom surface.

2. The device according to claim 1, further comprising an impurity diffusion region formed in a region contacting a lower portion of the oblique surface of the substrate, the impurity diffusion region containing an impurity of a type different from an impurity contained in the source/drain regions.

3. The device according to claim 2, wherein the impurity contained in the impurity diffusion region is carbon.

4. The device according to claim 1, wherein a portion of the gate insulating film provided on the side surface is thicker than a portion of the gate insulating film provided on the bottom surface.

5. The device according to claim 4, wherein the portion of the gate insulating film provided on the side surface is thicker than a portion of the gate insulating film provided on the oblique surface, and the portion of the gate insulating film provided on the oblique surface is thicker than the portion of the gate insulating film provided on the bottom surface.

6. The device according to claim 1, further comprising a plurality of device isolation insulators buried in an upper layer portion of the substrate to extend in one direction and divide the upper layer portion into a plurality of active areas,
the trench being made to extend in an arrangement direction of the active areas and the device isolation insulators across the plurality of active areas and the plurality of device isolation insulators.

7. The device according to claim 6, wherein a width of a portion of the trench made inside the device isolation insulator is wider than a width of a portion of the trench made inside the active area.

8. A semiconductor device, comprising:
a substrate made of monocrystalline silicon, a trench being made in an upper surface of the substrate;
a gate electrode provided in at least an interior of the trench;
source/drain regions formed in regions of the substrate having the trench interposed;
a gate insulating film provided between the substrate and the gate electrode,
a portion of an inner surface of the trench being formed of a (111) plane of silicon, and
the source/drain region being in contact with a side surface of the trench and being apart from a central portion of a bottom surface of the trench; and
an impurity diffusion region formed in a region of the substrate contacting the trench and being apart from the central portion of the bottom surface, the impurity diffusion region containing an impurity of a type different from an impurity contained in the source/drain regions,
wherein the impurity contained in the impurity diffusion region is carbon.

9. A method for manufacturing a semiconductor device, comprising:
forming a mask film on a substrate made of monocrystalline silicon, an upper surface of the substrate being a (100) plane of silicon, an opening being made in the mask film;
making a trench by performing wet etching using an alkaline etchant and using the mask film as a mask, the trench including a bottom surface made of a (100) plane of silicon, a pair of oblique surfaces made of (111) planes of silicon contacting the bottom surface, and a pair of side surfaces made of (110) planes of silicon contacting the oblique surfaces;
forming a gate insulating film on the bottom surface, on the oblique surfaces, and on the side surfaces;
forming a gate electrode in at least an interior of the trench;
implanting an impurity into regions of the substrate having the trench interposed; and
forming source/drain regions by causing the impurity to diffuse, the source/drain regions being in contact with the side surfaces and the oblique surfaces and being apart from a central portion of the bottom surface.

10. The method according to claim 9, further comprising performing dry etching using the mask film as a mask prior to the wet etching.

11. The method according to claim 10, further comprising implanting an impurity of a type different from the impurity contained in the source/drain regions after the dry etching and prior to the wet etching.

12. The method according to claim 11, wherein carbon is implanted as the impurity of the different type.

13. The method according to claim 9, wherein the alkaline etchant includes one type of chemical liquid selected from the group consisting of a mixed liquid of aqueous hydrogen peroxide and TMY, potassium hydroxide, tetramethyl ammonium hydroxide, ethylene diamine pyrocatechol, and hydrazine hydrate.

14. The method according to claim 9, wherein the implanting the impurity into the regions having the trench interposed is performed using the gate electrode as a mask.

* * * * *